(12) United States Patent
Korczynski et al.

(10) Patent No.: US 9,023,739 B2
(45) Date of Patent: May 5, 2015

(54) SITE-ISOLATED RAPID THERMAL PROCESSING METHODS AND APPARATUS

(71) Applicant: Intermolecular, Inc., San Jose, CA (US)

(72) Inventors: Ed Korczynski, San Jose, CA (US); Dipankar Pramanik, Saratoga, CA (US)

(73) Assignee: Intermolecular, Inc., San Jose, CA (US)

( * ) Notice: Subject to any disclaimer, the term of this patent is extended or adjusted under 35 U.S.C. 154(b) by 216 days.

(21) Appl. No.: 13/722,624

(22) Filed: Dec. 20, 2012

(65) Prior Publication Data
US 2014/0179123 A1   Jun. 26, 2014

(51) Int. Cl.
*H01L 21/26* (2006.01)
*H05B 1/02* (2006.01)
*H01L 21/268* (2006.01)
*H01L 21/67* (2006.01)

(52) U.S. Cl.
CPC .......... *H05B 1/0233* (2013.01); *H01L 21/2686* (2013.01); *H01L 21/67115* (2013.01); *H01L 21/67253* (2013.01)

(58) Field of Classification Search
CPC ............ H01L 21/0268; H01L 27/1285; H01L 21/2686; H01L 21/67115; H01L 21/67253; H05B 1/0233
USPC .................. 438/795, 546, 549, 550, 553, 555
See application file for complete search history.

(56) References Cited

U.S. PATENT DOCUMENTS

| 7,176,405 | B2 * | 2/2007 | Shareef et al. | ............. 219/121.6 |
| 8,065,107 | B1 | 11/2011 | Phatak | |
| 2005/0148208 | A1 * | 7/2005 | Chang et al. | .................. 438/795 |

OTHER PUBLICATIONS

Trivedi, V., et al.; Evaluation of rapid thermal processing systems for use in CMOS fabrication; Dec. 3, 2001; Pergamon Press; Solid-State Electronics, pp. 777-783.

* cited by examiner

*Primary Examiner* — Kevin M Picardat

(57) ABSTRACT

Methods and apparatus are described that allow the investigation of process variables used in RTP systems to be varied in a combinatorial manner across a plurality of site-isolated regions designated in the surface of a substrate. The methods and apparatus allow process variables such as power, dwell time, light source, cooling gas composition, cooling gas flow rate, reactive gas composition, reactive gas flow rate, and substrate support temperature and the like to be investigated.

17 Claims, 11 Drawing Sheets

SITE-ISOLATED RAPID THERMAL PROCESSING METHODS AND APPARATUS

TECHNICAL FIELD

The present disclosure relates generally to use of combinatorial techniques applied to rapid thermal processing.

BACKGROUND

Rapid-thermal processing (RTP) is a standard production technology for electronics manufacturing. In particular, RTP systems employing mercury-arc lamp arrays have been used to process silicon (Si) wafers for the creation of semiconductor devices. High volume manufacturing RTP systems have been designed to create uniform temperatures across the substrate surface.

Heretofore, RTP systems have been used to provide uniform temperature for entire substrates, and experimental studies of process variables have required dedicating an entire wafer to each process condition to be tested. What is needed is a system that allows systematic exploration of process variables in a combinatorial manner with many variations on a single substrate, especially for RTP applications. The most promising process parameters can then be extended to the processing of entire substrates.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

In some embodiments, apparatus are described that allow the investigation of process variables used in RTP systems to be varied in a combinatorial manner across a plurality of site-isolated regions designated in the surface of a substrate. The apparatus allow process variables such as power, dwell time, light source, cooling gas composition, cooling gas flow rate, reactive gas composition, reactive gas flow rate, and substrate support temperature and the like to be investigated.

In some embodiments, methods are described that allow the processing of a plurality of site-isolated regions designated in the surface of a substrate using RTP, wherein the process variables are varied in a combinatorial manner across the plurality of site-isolated regions. The methods allow process variables such as power, dwell time, light source, cooling gas composition, cooling gas flow rate, reactive gas composition, reactive gas flow rate, and substrate support temperature and the like to be investigated.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

Figure 1:
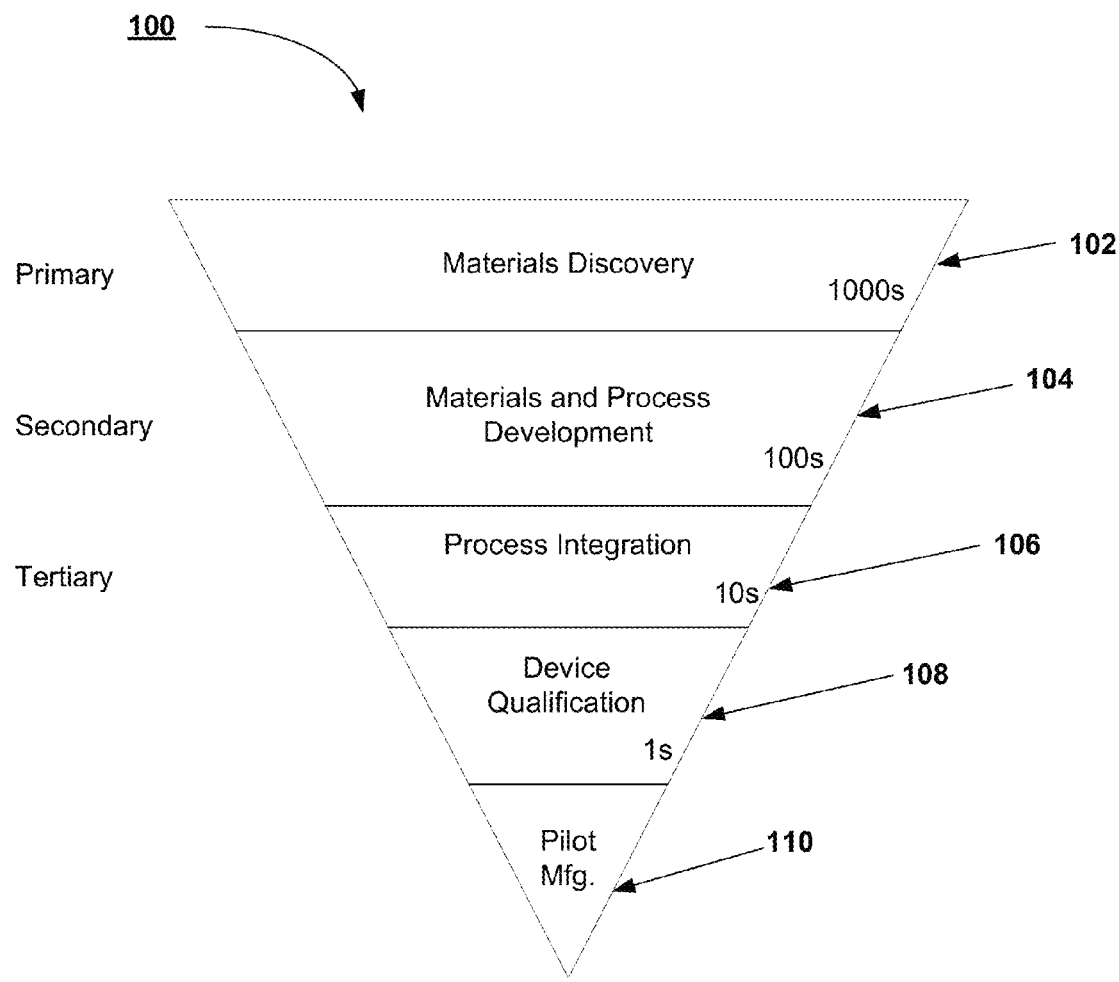
FIG. 1 illustrates a schematic diagram for implementing combinatorial processing and evaluation.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Before various embodiments are described in detail, it is to be understood that unless otherwise indicated, this invention is not limited to specific layer compositions or surface treatments. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The term "about" generally refers to ±10% of a stated value.

The term "site-isolated" as used herein refers to providing distinct processing conditions, such as controlled temperature, flow rates, chamber pressure, processing time, plasma composition, and plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the target conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

The term "substrate" as used herein may refer to any workpiece on which formation or treatment of material layers is desired. Substrates may include, without limitation, silicon, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes can vary and include commonly used round wafers of 2", 4", 200 mm, or 300 mm in diameter.

The term "remote plasma source" as used herein refers to a plasma (e.g., an rf or microwave generated plasma) located at a distance from a deposition or treatment location sufficient to allow some filtering of the plasma components. For example, the density of ions and electrons can be adjusted by distance, and electrons and ions can also be filtered out using suitable electrode configurations, such as a grounded metal showerhead so that only atomic or molecular radicals reach the substrate.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

The present invention is described in one or more embodiments in the following description with reference to the Figures, in which like numerals represent the same or similar elements. While the invention is described in exemplary terms which include a best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Embodiments of the present invention provide a system for systematic exploration of plasma treatment process variables in a combinatorial manner with the possibility of performing many variations on a single substrate. The combinatorial processing permits a single substrate to be systematically explored using different plasma processing conditions, and reduces or eliminates variables that interfere with research quality. The apparatuses and methods disclosed herein permit the systematic exploration of plasma treatments on a single substrate using combinatorial methods, and removes the run to run variability and inconsistencies between substrates that hamper research and optimization of process variables.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention.

While the combinatorial processing varies certain materials, hardware details, or process sequences, the composition or thickness of the layers or structures or the actions, such as cleaning, surface preparation, deposition, surface treatment, etc. is substantially uniform through each discrete region. Furthermore, while different materials or processes may be used for corresponding layers or steps in the formation of a structure in different regions of the substrate during the combinatorial processing, the application of each layer or use of a given process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
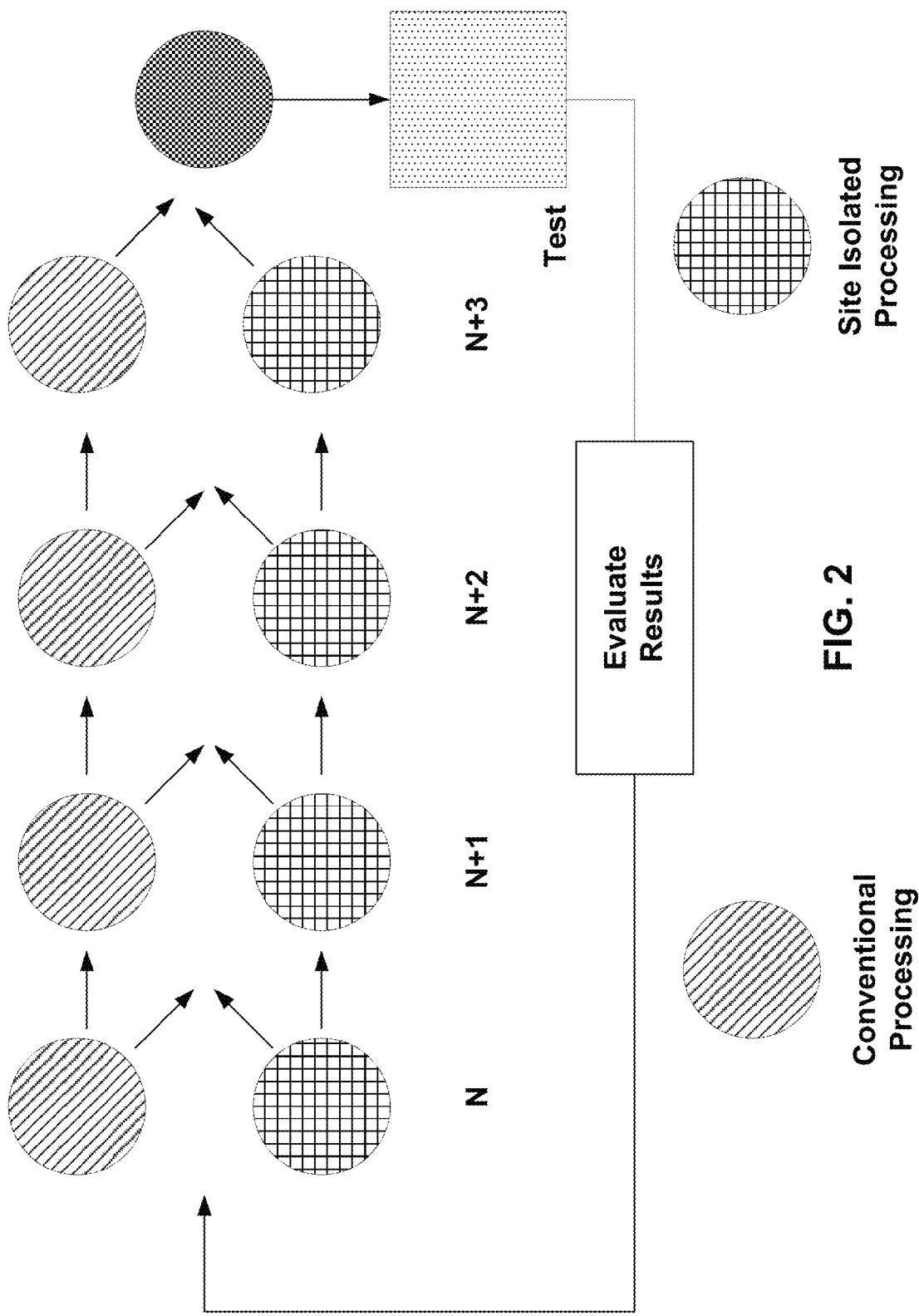
FIG. 2 presents a schematic diagram for illustrating various process sequences using combinatorial processing and evaluation.

FIG. 2 is a simplified schematic diagram illustrating a general methodology for combinatorial process sequence integration that includes site-isolated processing and/or conventional processing in accordance with one embodiment of the invention. In one embodiment, the substrate is initially processed using conventional process N. In one exemplary embodiment, the substrate is then processed using site-isolated process N+1. During site-isolated processing, an HPC module may be used, such as the HPC module described in U.S. patent application Ser. No. 11/352,077 filed on Feb. 10, 2006. The substrate can then be processed using site-isolated process N+2, and thereafter processed using conventional process N+3. Testing is performed and the results are evaluated. The testing can include physical, chemical, acoustic, magnetic, electrical, optical, etc. tests. From this evaluation, a particular process from the various site-isolated processes (e.g. from steps N+1 and N+2) may be selected and fixed so that additional combinatorial process sequence integration may be performed using site-isolated processing for either process N or N+3. For example, a next process sequence can include processing the substrate using site-isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above process flows can be applied to entire monolithic substrates, or portions of the monolithic substrates.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, the order in which materials are deposited, hardware details of the gas distribution assembly, etc. It should be appreciated that these process parameters are exemplary and not meant to be an exhaustive list as other process parameters commonly used with plasma exposure systems may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Substrates may be a conventional round 200 mm, 300 mm, or any other larger or smaller substrate/wafer size. In other embodiments, substrates may be square, rectangular, or other shape. One skilled in the art will appreciate that substrate may be a blanket substrate, a coupon (e.g., partial wafer), or even a patterned substrate having predefined regions. In some embodiments, a substrate may have regions defined through the processing described herein.

Software is provided to control the process parameters for each wafer for the combinatorial processing. The process parameters comprise selection of one or more source gases for the plasma generator, plasma filtering parameters, exposure time, substrate temperature, power, frequency, plasma generation method, substrate bias, pressure, gas flow, or combinations thereof.

Figure 3:
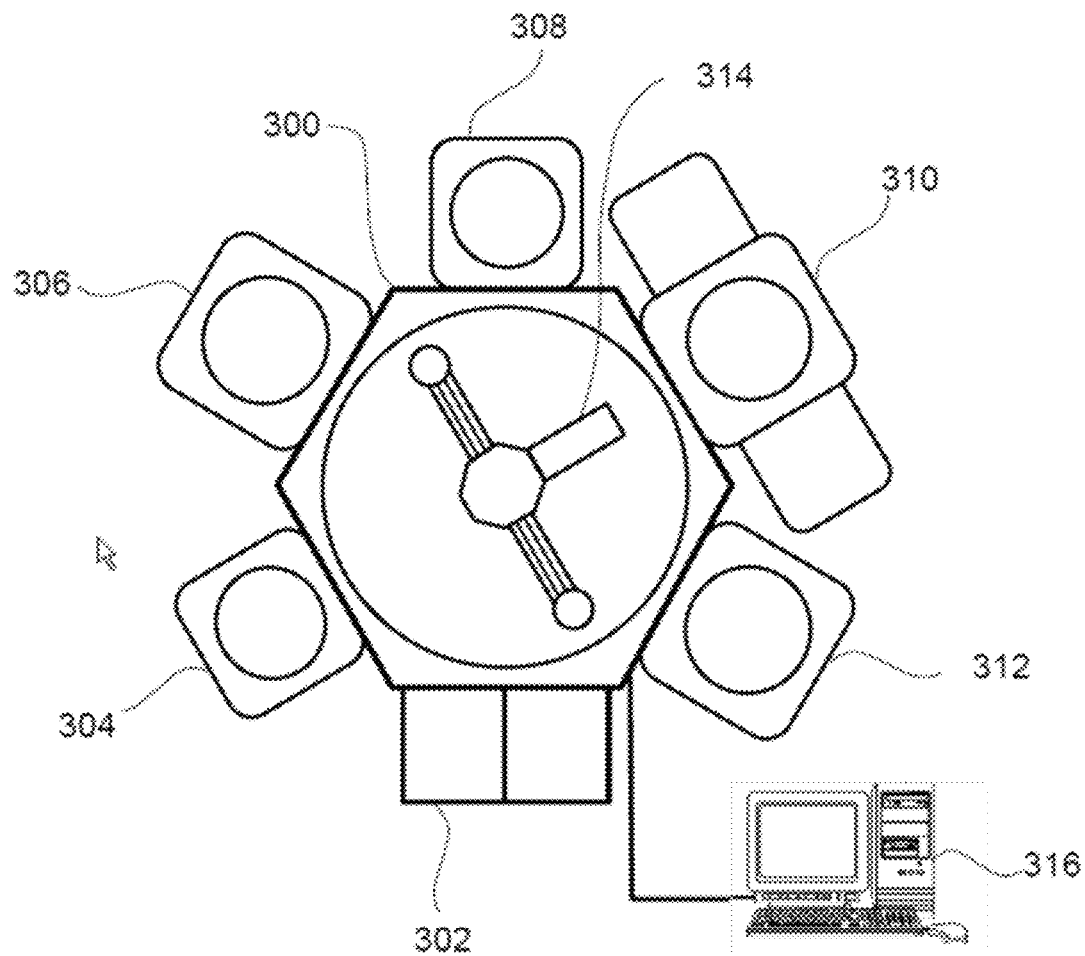
FIG. 3 illustrates a processing system enabling combinatorial processing.

FIG. 3 is a simplified schematic diagram illustrating an integrated high productivity combinatorial (HPC) system in accordance with some embodiments of the invention. The HPC system includes a frame 300 supporting a plurality of processing modules. It will be appreciated that frame 300 may be a unitary frame in accordance with some embodiments. In some embodiments, the environment within frame 300 is controlled. A load lock 302 provides access into the plurality of modules of the HPC system. A robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system. Further details of one possible HPC system are described in U.S. application Ser. Nos. 11/672,478 and 11/672,473, the entire disclosures of which are herein incorporated by reference. In a HPC system, a plurality of methods may be employed to deposit material upon a substrate employing combinatorial processes.

RTP processes are used in several during the manufacture of semiconductor, optoelectronic, and thin film photovoltaic devices. The RTP process may be used as a thermal treatment, wherein the substrate is heated in an inert atmosphere. The RTP process may be used as a reactive treatment, wherein the substrate is heated in a reactive atmosphere (e.g. an atmosphere that contains an oxygen species or a nitrogen species) to form an oxide or a nitride layer at the surface. As discussed previously, current RTP systems are designed to produce a uniform temperature across the entire surface of the substrate.

Figure 4A:
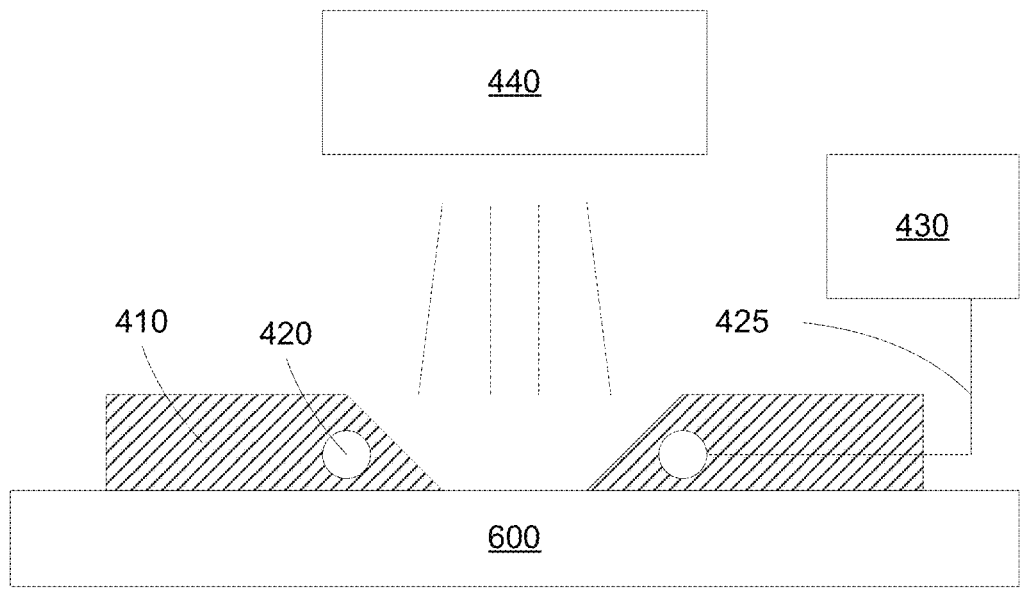
FIGS. 4A and 4B illustrate apparatus enabling combinatorial processing using RTP.
Figure 4B:
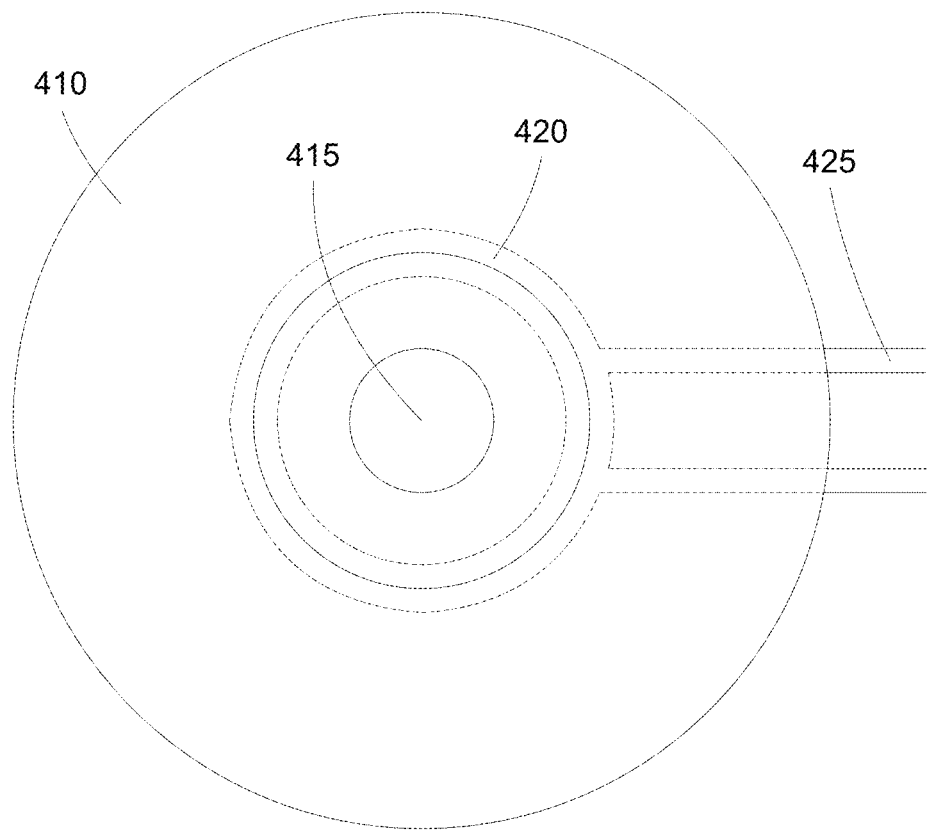

FIGS. 4A and 4B illustrate apparatus enabling combinatorial processing using RTP. The figures illustrate the use of a cooled aperture structure to allow the definition and processing of a plurality of site-isolated regions on a substrate using RTP. An apertured shield, 410, can be placed on a substrate, 400, during a process, such as a RTP process. For example, a RTP heat source, 440, can be used to heat the substrate, 400, through an opening, 415, of the apertured shield, 410. The opening, 415, is shown having a circular shape, but any shape can be used, such as hexagonal or square. The apertured shield, 410, can form intimate contact with the substrate, 400, allowing heat transfer between the apertured shield and the substrate. For example, the bottom surface of the apertured shield, (e.g., the surface of the apertured shield that is configured to be placed on the substrate), can be flat and smooth, for example, to improve the heat conduction between the substrate and the apertured shield. Channels, 420, can be provided within the apertured shield, 410, to control the temperature of the apertured shield, for example, through circulating fluid supplied from a reservoir, 430, to conduits, 425. The channels, 420, can be configured to surround the opening, 415, of the apertured shield, allowing effective cooling of the substrate region exposed by the opening, 415. The circulating fluid can include a gas, such as air, or a liquid, such as water. A heater or a cooler can be provided to regulate the temperature of the circulating fluid, maintaining the apertured shield at a desired temperature, such as room temperature or a temperature below 100 C.

Without the temperature controlled apertured shield, the substrate can heat up during the RTP process. In some embodiments, the temperature of the substrate can be controlled through a substrate support. The apertured shield can further regulate the substrate temperature, especially for low thermal conductivity substrates such as glass or ceramic. Since the apertured shield can regulate the temperature of the substrate top surface, (e.g., the surface where the deposition occurs), the apertured shield can be used for various substrates, including substrates having low thermal conductivity properties.

In some embodiments, the temperature controlled apertured shield can be made from high thermal conductivity material, and can include inner channels for circulated coolant. By regulating the temperature of the coolant, for example, though a heat exchanger or a cooling mechanism, the apertured shield can be maintained at a desired temperature, leading to a desired temperature of the site isolated region. By using a high thermal conductivity material, the temperature of the apertured shield can be uniform, and heat can be dissipated quickly by the circulated coolant. The apertured shield can be made from materials having thermal conductivity greater than that of glass, (e.g., greater than about 0.1 W/(m.K)). The apertured shield can be made from materials having thermal conductivity greater than about 1 W/(m.K).

In some embodiments, methods and systems for combinatorially processing a substrate using RTP are provided. For example, in a first processing step, a first site isolated region of a substrate, defined by an apertured shield, is processed, for example, by RTP. In a second processing step, sequentially executed after the first step, a second site isolated region of the substrate, contiguous (e.g., adjacent without overlapping) to the first region, is processed. The second site isolated region of the substrate is also defined by the apertured shield, which moves to process the second region. The first region and the second region may be separated by a gap. The process parameters used to process the multiple site isolated regions, such as power, dwell time, light source, cooling gas composition, cooling gas flow rate, reactive gas composition, reactive gas flow rate, and substrate support temperature may be investigated and varied in a combinatorial manner. The combinatorial process can provide a simple and cost effective screening of manufacturing operations to derive optimum manufacturing methods or integration sequences.

Figure 5A:
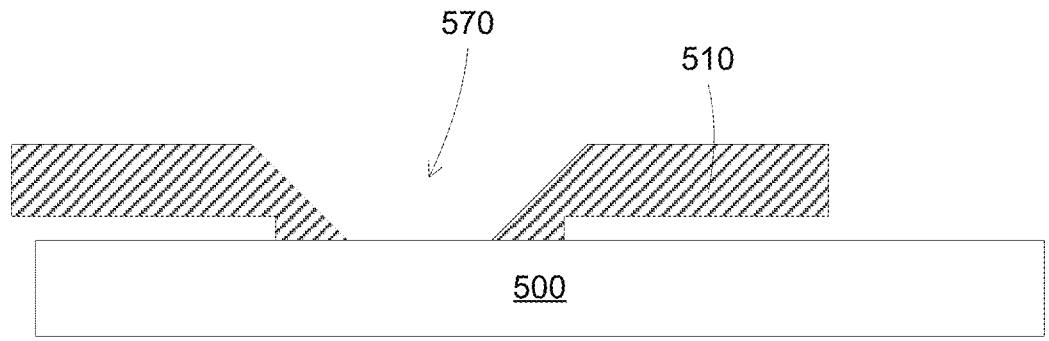
FIGS. 5A-5C illustrate methods enabling combinatorial processing using RTP.
Figure 5B:
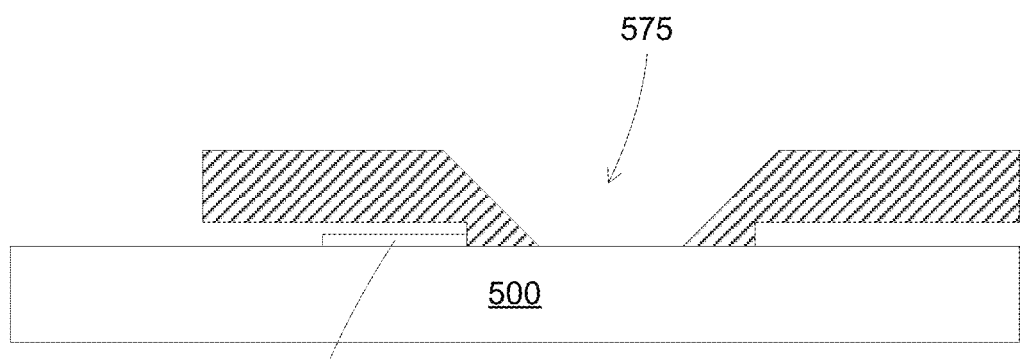
Figure 5C:
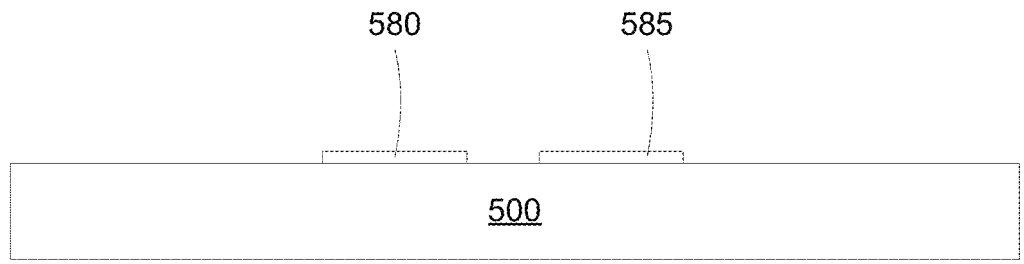

FIGS. 5A-5C illustrate an example of a sequential combinatorial process according to some embodiments. In FIG. 5A, a first process is performed on a substrate 500, including placing an apertured shield 510 on the substrate 500 for processing a site isolated region 570. Details of the apertured shield can be found in co-owned U.S. patent application Ser. No. 13/686,072 filed on Nov. 27, 2012, which is herein incorporated by reference for all purposes. The apertured shield 510 is shown as a schematic representation without all the details for simplicity purposes. In reality, the apertured shield 510 can include other components and elements described in this specification, such as cooling channels, cooling conduits, cooling reservoir, cooling circulation mechanism, and top and bottom shields.

In FIG. 5B, after processing site-isolated region, 580, using the first process, a second process is sequentially performed on the substrate 500, after the first process. For example, the apertured shield, 510, can move relative to the substrate, 500, to be positioned on an adjacent region, 575. As shown, the apertured shield, 510, is positioned near the previously processed region, 580, to isolate a new region, 570. The positioning of the apertured shield can allow processing the substrate without allowing the site-isolated region to overlap, (e.g., regions 580, and 570).

FIG. 5C illustrates the configuration of the processed regions, 580, and 585, forming site isolated regions on the substrate. The processed regions, 580, and 585, are formed by applying a RTP process on the site isolated regions, 570 and 575, in the first and second process, respectively. As discussed previously, the RTP process within each site-isolated region may be used as a thermal treatment, wherein the substrate is heated in an inert atmosphere. The RTP process may be used as a reactive treatment, wherein the substrate is heated in a reactive atmosphere (e.g. an atmosphere that contains an oxygen species or a nitrogen species) to form an oxide or a nitride layer at the surface.

In some embodiments, combinatorial processes are disclosed in which site-isolated regions are surrounded by a temperature controlled apertured shield. The temperature controlled apertured shield can provide additional cooling to the substrate, especially at the site isolated region being processed.

In some embodiments, a combinatorial reactor assembly having a temperature controlled apertured shield can press on a region of the substrate surface to create a site-isolated region. The temperature controlled apertured shield can regulate the temperature of the site isolated region to reduce heat flow away from the site-isolated region during combinatorial RTP processing.

In some embodiments, systems and methods for regulating temperature of site-isolated regions on a substrate are provided, allowing combinatorial RTP processing under controlled temperature. A site-isolated region can be sealed through a temperature controlled apertured shield, which can be effective for regulating the temperature of the site-isolated region, allowing a desired temperature for the RTP process.

In some embodiments, the temperature controlled apertured shield can be used in a high productivity combinatorial (HPC) system. During normal operation of an HPC system, a reactor module including multiple reactors having temperature controlled apertured shields can create multiple site-isolated regions on a substrate surface. The site-isolated regions then can be processed with process conditions varying in a combinatorial manner.

In some embodiments, a combinatorial processing chamber can be provided. The combinatorial processing chamber can include a substrate support and a combinatorial reactor assembly, wherein the substrate support is disposed under the combinatorial reactor assembly. The substrate support is configured to receive a substrate and can be coupled to a movement mechanism for rotating, horizontally translating or up/down movements. The combinatorial reactor assembly can include a RTP source, configured to illuminate one or more site-isolated regions on the substrate. A temperature controlled apertured shield can be included to regulate the temperature of the substrate, such as the site isolated regions that are being processed.

A substrate can be introduced to the substrate support, for example, from a loading station, and through a robotic transfer mechanism. The substrate support can be raised up, to be coupled with the apertured shield of the combinatorial reactor assembly. One or more site isolated regions on the substrate can be processed using the combinatorial reactor assembly.

After completing processing, the substrate is lowered to be separated from the combinatorial reactor assembly, and then moved relative to the combinatorial reactor assembly. For example, the substrate or the substrate support can be rotated or translated while the combinatorial reactor assembly is stationary, so that the reactor assembly is positioned at different regions on the substrate surface. Alternatively, the combinatorial reactor assembly can be rotated or translated while the substrate is stationary. In some embodiments, the substrate is moved so that the reactor assembly can be positioned at second substrate surface regions between the first already-processed substrate surface regions. The process can continue, (e.g., additional site isolated regions on the substrate can be processed using the combinatorial reactor assembly). The processing can be repeated, for example, until the whole substrate is processed.

The combinatorial processing technique can be used to develop and investigate materials and processes for device processing and manufacturing. For example, in the combinatorial process, process parameters used to process the one or more regions are varied in a combinatorial manner. Alternatively, at least one region of the one or more regions is processed differently from at least one other region of the one or more regions. For example, different processing times can be used for different site isolated regions.

Figure 6:
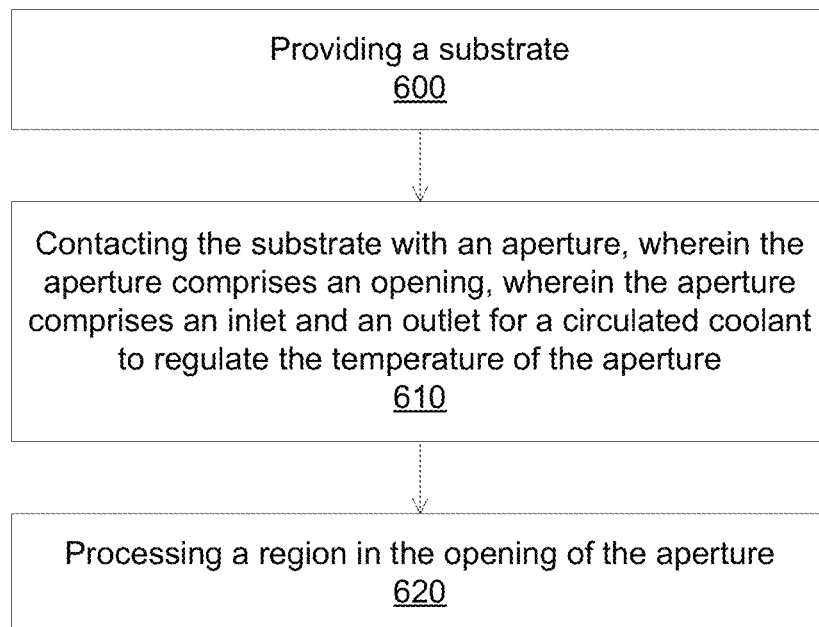
FIG. 6 presents a flow chart illustrating the steps of methods according to some embodiments.

FIG. 6 illustrates a flowchart for processing a substrate according to some embodiments. In operation 600, a substrate is provided. The substrate can include a silicon wafer, glass, ceramic, or any other useful substrate. Other processes can be performed on the substrate, such as a cleaning process, or a bottom electrode deposition for capacitor structure fabrication. In operation 610, the substrate is contacted by an apertured shield. The apertured shield can be a part of a process assembly, which can include a RTP source and gas sources. The apertured shield can include an opening, which can expose the substrate and form a site-isolated region on the substrate. The apertured shield can be temperature controlled, for example, having an inlet and an outlet for a circulated coolant to regulate the temperature of the apertured shield. In operation 620, a region can be processed in the opening of the apertured shield. The region can be processed by a RTP process. In some embodiments, the method can further include circulating a gaseous or liquid coolant to the apertured shield, or maintaining the temperature of the apertured shield at room temperature or below 100 C by the circulated coolant.

In some embodiments, multiple site-isolation regions are processed on a substrate, with varying process conditions for the different site-isolated regions. As discussed previously, the RTP process within each site-isolated region may be used as a thermal treatment, wherein the substrate is heated in an inert atmosphere. The RTP process may be used as a reactive treatment, wherein the substrate is heated in a reactive atmosphere (e.g. an atmosphere that contains an oxygen species or a nitrogen species) to form an oxide or a nitride layer at the surface. RTP process variables such as power, dwell time, light source, cooling gas composition, cooling gas flow rate, reactive gas composition, reactive gas flow rate, and substrate support temperature may be investigated and varied in a combinatorial manner.

Figure 7:
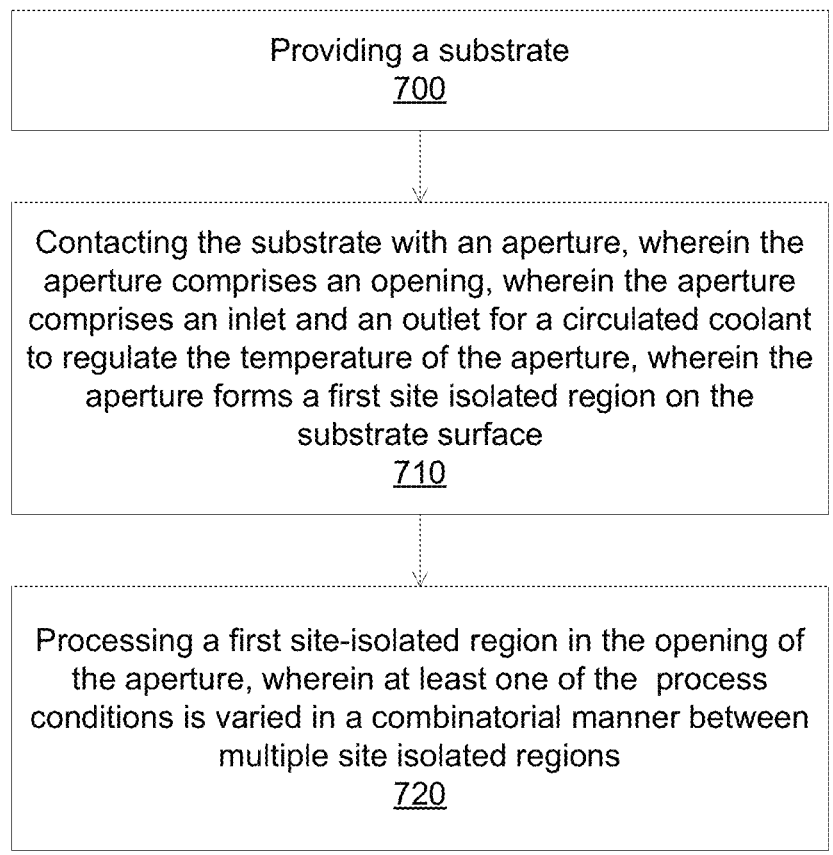
FIG. 7 presents a flow chart illustrating the steps of methods according to some embodiments.

FIG. 7 illustrates a flowchart for combinatorially processing a substrate according to some embodiments. Different process conditions using a RTP process can be used to fabricate devices. The characteristics and the performance of the regions can provide the properties of the regions, permitting a quick ranking of various materials and process conditions. Poor performance combinations, together with sub-optimum process conditions can be identified and removed without the need to fabricate and test fully-operational devices.

In operation 700, a substrate is provided. The substrate can include a silicon wafer, glass, ceramic, or any other useful substrate. The substrate can be positioned on a substrate support and under a combinatorial reactor assembly. A combinatorial process can be provided to form multiple site-isolated regions on the substrate using the combinatorial reactor assembly. In operation 710, the substrate is contacted by an apertured shield. The apertured shield can be a part of a process assembly, which can include a RTP source and gas sources. The apertured shield can include an opening, which can expose the substrate and form a site-isolated region on the substrate. The apertured shield can be temperature controlled, for example, having an inlet and an outlet for a circulated coolant to regulate the temperature of the apertured shield.

In operation 720, a region can be processed in the opening of the apertured shield. The region can be processed by a RTP process. The region can be processed by a RTP process. In some embodiments, the method can further include circulating a gaseous or liquid coolant to the apertured shield, or maintaining the temperature of the apertured shield at room temperature or below 100 C by the circulated coolant.

The substrate can be moved relative to the combinatorial reactor assembly. Other site-isolated regions on the substrate can continue to be processed using the combinatorial reactor assembly. The layers in multiple-site isolated regions can be characterized according to each site isolated regions. The characterization can include structural characterization, such as interface bonding, amorphous layer or polycrystalline layer. The characterization can include optical or electrical characterization. The data related to the performance of the layers or devices can be extracted from the characterization. The optimum layers, including materials and process conditions can be selected based on a comparison of the layer performance.

In some embodiments, the method can further include circulating a gaseous or liquid coolant to the apertured shield, or maintaining the temperature of the apertured shield to be less than 100 C, including at room temperature, by the circulated coolant.

In some embodiments, multiple site-isolation regions are processed on a substrate, with varying process conditions for the different site-isolated regions. As discussed previously, the RTP process within each site-isolated region may be used as a thermal treatment, wherein the substrate is heated in an inert atmosphere. The RTP process may be used as a reactive treatment, wherein the substrate is heated in a reactive atmosphere (e.g. an atmosphere that contains an oxygen species or a nitrogen species) to form an oxide or a nitride layer at the surface. RTP process variables such as power, dwell time, light source, cooling gas composition, cooling gas flow rate, reactive gas composition, reactive gas flow rate, and substrate support temperature may be investigated and varied in a combinatorial manner.

Figure 8:
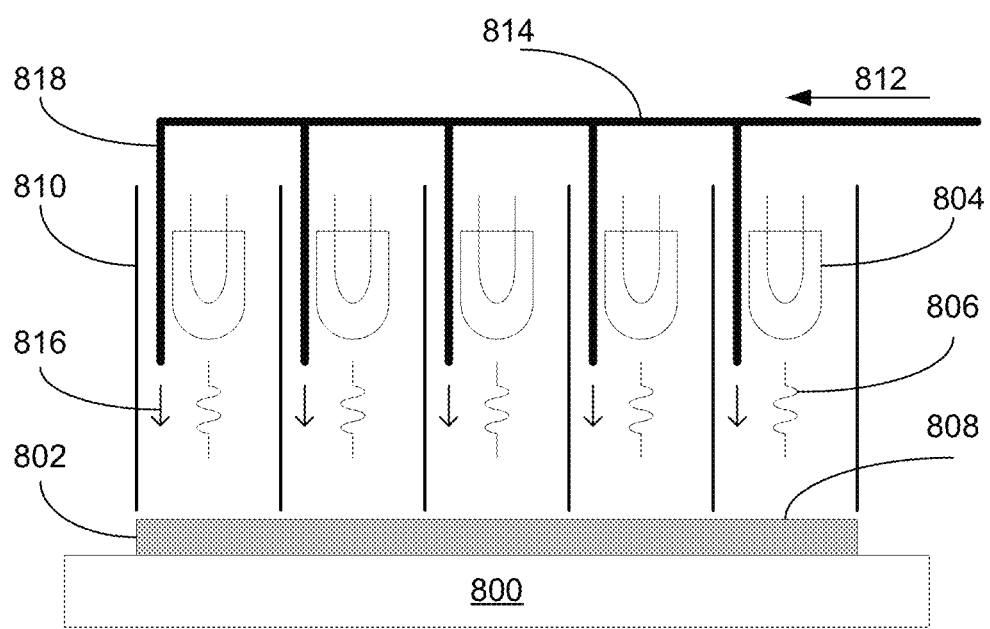
FIG. 8 illustrates an apparatus enabling combinatorial processing using RTP.

FIG. 8 illustrates apparatus enabling combinatorial processing using RTP. The figure illustrates the use of an array of reactor cells to allow the definition and processing of a plurality of site-isolated regions on a substrate using RTP. The array of reactor cells can be part of a combinatorial reactor assembly (not shown). The apparatus includes a substrate support, 800, used to support a substrate, 802. As discussed previously, the substrate support may include the capability of active heating and/or cooling. A number of reactor cells including RTP light sources, 804, are arranged in an array to illuminate the substrate surface. The light sources can be any source well known in the art. Each light source, 804, emits radiation, 806, that is incident on a site-isolated region, 808, of the surface of the substrate. The site-isolated regions, 808, are defined by walls, 810, that enclose the light source, 804, and prevent radiation from illuminating adjacent regions. The walls may be formed from any opaque material. The walls may enclose an area on the site-isolated region, 808, that is circular in shape. However, this is not limiting and the shape defined by the walls can be any useful shape such as triangular, square, rectangular, hexagonal, octagonal, and the like. A gas flow, 812, can be introduced into a manifold, 814, that can be used to provide a gas flow, 816, through gas delivery conduits, 818, into the volume defined by the walls. As indicated in FIG. 8, there is a gas delivery conduit, 818, for each of the reactor cells. Those skilled in the art will understand that manifold, 814, and gas delivery conduits, 816, can be configured to deliver different compositions and/or different gas flow rates to each of the reactor cells. The gas can supply cooling to the site-isolated region, 808, or can supply a reactive gas to form react with the surface to form a new material at the surface of the substrate. RTP process variables such as power, dwell time, light source, cooling gas composition, cooling gas flow rate, reactive gas composition, reactive gas flow rate, and substrate support temperature may be investigated and varied in a combinatorial manner.

Figure 9:
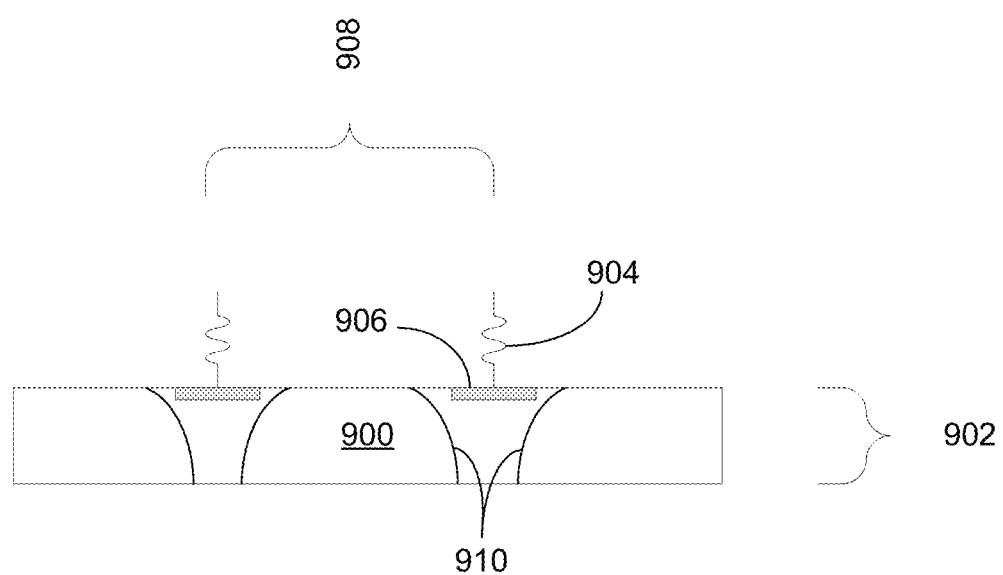
FIG. 9 illustrates the cooling profile during combinatorial processing using RTP.

Many applications of RTP processes use silicon as the substrate. Silicon has a thermal conductivity of about 149 W/m.K. Therefore, steps must taken to ensure that the RTP process within one site-isolated region does not impact the temperature within adjacent site-isolated regions. FIG. 9 illustrates the cooling profile during combinatorial processing using RTP according to some embodiments. FIG. 9 illustrates a substrate, 900, having a thickness, 902. Two RTP sources (not shown) emit radiation, 904, that is incident on site-isolated regions, 906. Any number of RTP sources can be used, two are illustrated for clarity. Further, each RTP source can be contained within walls (not shown) to limit the radiation to a single site-isolated region as discussed previously. The RTP sources are spaced apart from one another by a distance, 908. Typically, the spacing between adjacent RTP sources, 908, is much greater than the thickness of the substrate, 902. This configuration ensures that the heat flow profile within the substrate, 910, will not overlap. The heat flow profile, 910, illustrated in FIG. 9 is for discussion purposes only and is not meant to represent an actual profile. Generally, if the total energy flux incident on the surface of the site-isolated region in known, then the heat flow profile can be estimated using typical thermal modeling techniques.

Figure 10:
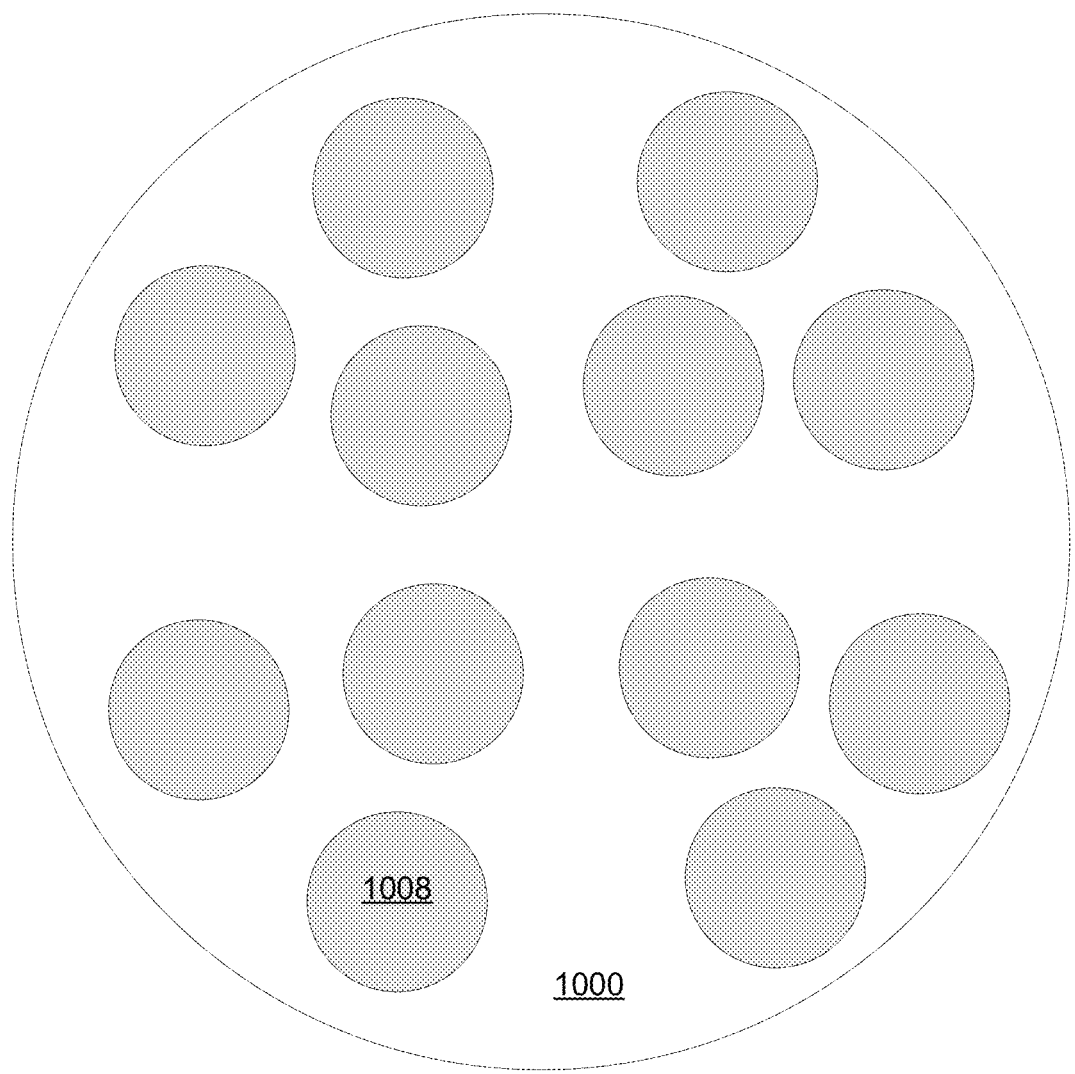
FIG. 10 presents an illustration of the plurality of site-isolated regions according to some embodiments.

FIG. 10 presents an illustration of the plurality of site-isolated regions according to some embodiments. FIG. 10 illustrates a substrate, 1000, having a number of site-isolated regions, 1008, defined thereon. The number and configuration of the site-isolated regions shown in FIG. 10 are for illustration purposes only and are not limiting. As an example, the site-isolated regions can be configured in concentric rings, orthogonal arrays, or any other useful pattern. The only limitation is that the site-isolated regions should be spaced far enough apart so that the heat flow profiles do not overlap as discussed previously.

Figure 11:
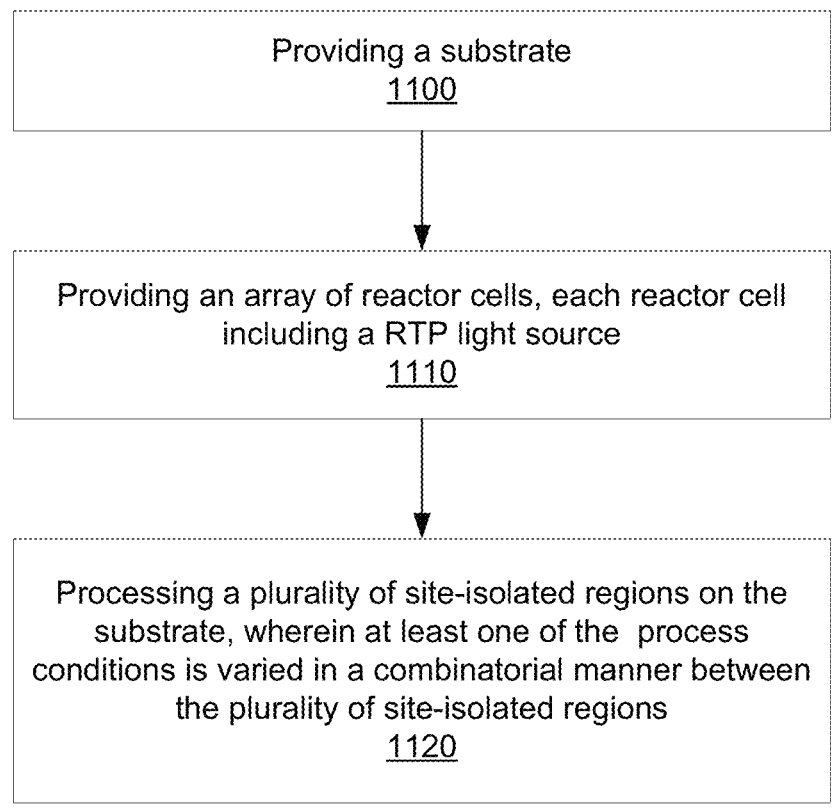
FIG. 11 presents a flow chart illustrating the steps of methods according to some embodiments.

FIG. 11 illustrates a flowchart for combinatorially processing a substrate according to some embodiments. Different process conditions using a RTP process can be used to fabricate devices. The characteristics and the performance of the regions can provide the properties of the regions, permitting a quick ranking of various materials and process conditions. Poor performance combinations, together with sub-optimum process conditions can be identified and removed without the need to fabricate and test fully-operational devices.

In operation 1100, a substrate is provided. The substrate can include a silicon wafer, glass, ceramic, or any other useful substrate. The substrate can be positioned on a substrate support and under a combinatorial reactor assembly. In operation 1110, an array of reactor cells is provided, each reactor cell including a RTP source. The array of reactor cells is operable to define a plurality of site-isolated region on the surface of the substrate.

In operation 1120, multiple site-isolation regions are processed on a substrate, with varying process conditions for the different site-isolated regions. As discussed previously, the RTP process within each site-isolated region may be used as a thermal treatment, wherein the substrate is heated in an inert atmosphere. The RTP process may be used as a reactive treatment, wherein the substrate is heated in a reactive atmosphere (e.g. an atmosphere that contains an oxygen species or a nitrogen species) to form an oxide or a nitride layer at the surface. RTP process variables such as power, dwell time, light source, cooling gas composition, cooling gas flow rate, reactive gas composition, reactive gas flow rate, and substrate support temperature may be investigated and varied in a combinatorial manner.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for processing a site isolated region, the method comprising providing a substrate;
   contacting the substrate with a shield, wherein the shield comprises an opening, wherein the shield comprises an inlet and an outlet for a circulated coolant to regulate the temperature of the shield;
   processing a region in the opening of the shield using a RTP process.

2. The method of claim 1 further comprising
   circulating a gaseous or liquid coolant to the shield.

3. The method of claim 1 further comprising
   maintaining the temperature of the shield by the circulated coolant.

4. The method of claim 3 further comprising
   maintaining the temperature of the shield to be less than 100 C by the circulated coolant.

5. The method of claim 1 wherein the substrate comprises a silicon wafer, a glass, or a ceramic substrate.

6. A method for processing a site isolated region in a high productivity combinatorial equipment, the method comprising
   providing a substrate;
   contacting the substrate with a shield, wherein the shield comprises an opening, wherein the shield comprises an inlet and an outlet for a circulated coolant to regulate the temperature of the shield, wherein the shield forms a first site-isolated region on the substrate surface;
   processing a first layer in the opening of the shield in the first site-isolated region using a first RTP process;
   moving the shield to a second site-isolated region;
   processing a second layer in the opening of the shield in the second site-isolated region using a second RTP process, wherein at least one of the material of the process condition of the first and second layers is varied in a combinatorial manner between the first and second site isolate regions.

7. The method of claim 6 further comprising
   circulating a gaseous or liquid coolant to the shield.

8. The method of claim 6 further comprising maintaining the temperature of the shield by the circulated coolant.

9. The method of claim 8 comprising
   maintaining the temperature of the shield to be less than 100 C by the circulated coolant.

10. The method of claim 6 wherein the substrate comprises a silicon wafer, a glass substrate, or a ceramic substrate.

11. The method of claim 6 wherein the shield at the second site isolated region does not overlap the first site isolated region.

12. The method of claim 6 wherein at least one process parameter is varied in a combinatorial manner.

13. The method of claim 12 wherein the process parameter is at least one of power, dwell time, light source, cooling gas composition, cooling gas flow rate, reactive gas composition, reactive gas flow rate, and substrate support temperature.

14. A method for processing a site isolated region, the method comprising providing a substrate;
   positioning a shield above the substrate, wherein the shield has an opening formed therethrough extending between an upper surface and a lower surface thereof and a manifold formed therethough that is isolated from the opening, and wherein the lower surface of the shield is in contact with the substrate and a region of the substrate is exposed through the opening;
   performing an RTP process on the exposed region of the substrate through the opening in the shield.

15. The method of claim 14 further comprising circulating a cooling fluid through the manifold in the shield during the performing of the RTP process.

16. The method of claim 15 wherein the manifold extends around a periphery of the opening.

17. The method of claim 15 further comprising
   after the performing of the RTP process on the exposed region of the substrate, moving the shield relative to the substrate to expose a second region of the substrate through the opening;
   performing a second RTP process on the second exposed region of the substrate through the opening in the shield, wherein at least one process parameter of the second RTP process is different than at least one process parameter of the RTP process, and the at least one process parameter of the second RTP process and the at least one process parameter of the RTP process comprise power, dwell time, light source, cooling fluid composition, cooling fluid flow rate, reactive gas composition, reactive gas flow rate, and substrate support temperature.

* * * * *